(12) United States Patent
Walther et al.

(10) Patent No.: US 8,616,059 B2
(45) Date of Patent: Dec. 31, 2013

(54) FORCE SENSOR WITH REDUCED NOISE (75) Inventors: Arnaud Walther, Grenoble (FR);
Guillaume Jourdan, Grenoble (FR);
Philippe Robert, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 264 days.

(21) Appl. No.: 13/045,934

(22) Filed: Mar. 11, 2011

(65) Prior Publication Data
US 2011/0219875 A1 Sep. 15, 2011

(30) Foreign Application Priority Data
Mar. 15, 2010 (FR) ...................................... 10 51831

(51) Int. Cl.
*G01P 15/097* (2006.01)
(52) U.S. Cl.
USPC ....................................................... 73/514.29
(58) Field of Classification Search
USPC ............... 73/514.29, 514.38, 514.36, 514.16, 73/514.01, 514.32–514.34, 504.12, 504.14
See application file for complete search history.

(56) References Cited

U.S. PATENT DOCUMENTS

| | | | | |
|---|---|---|---|---|
| 5,969,249 A * | 10/1999 | Roessig et al. | .............. | 73/514.15 |
| 6,067,858 A | 5/2000 | Clark et al. | | |
| 6,904,803 B2 * | 6/2005 | Baudry et al. | .............. | 73/514.29 |
| 7,258,012 B2 * | 8/2007 | Xie | .............. | 73/514.32 |
| 7,360,422 B2 * | 4/2008 | Madni et al. | .............. | 73/504.12 |
| 7,628,070 B2 * | 12/2009 | Brisson et al. | .............. | 73/514.29 |
| 7,980,133 B2 * | 7/2011 | Geen et al. | .............. | 73/504.04 |
| 8,136,401 B2 * | 3/2012 | Hentz et al. | .............. | 73/514.29 |
| 8,220,328 B2 * | 7/2012 | Rudolf et al. | .............. | 73/514.01 |
| 8,297,121 B2 * | 10/2012 | Quer et al. | .............. | 73/514.29 |
| 2002/0170355 A1 * | 11/2002 | Malametz | .................. | 73/514.29 |
| 2004/0226371 A1 | 11/2004 | Baudry et al. | | |
| 2007/0022812 A1 | 2/2007 | Brisson et al. | | |
| 2007/0084041 A1 | 4/2007 | Eklund et al. | | |
| 2007/0222011 A1 | 9/2007 | Robert et al. | | |
| 2008/0314148 A1 | 12/2008 | Robert | | |

(Continued)

FOREIGN PATENT DOCUMENTS

EP 1 742 069 A2 1/2007
EP 1 840 582 A1 10/2007

(Continued)

OTHER PUBLICATIONS

U.S. Appl. No. 13/459,592, filed Apr. 30, 2012, Walther.

(Continued)

*Primary Examiner* — Helen Kwok
(74) *Attorney, Agent, or Firm* — Oblon, Spivak, McClelland, Maier & Neustadt, L.L.P.

(57) ABSTRACT

A MEMS or NEMS device for detecting a force following a given direction, comprising a support and at least one seismic mass capable of moving under the effect of the force to be measured in the direction of the force, and a detector for detecting the movement of the seismic mass, the seismic mass being articulated relative to the support by at least one pivot link, and an actuator capable of varying the distance between the axis of the pivot link and the center of gravity of the exertion of the force on the seismic mass.

19 Claims, 7 Drawing Sheets

(56) References Cited

U.S. PATENT DOCUMENTS

2009/0139342 A1    6/2009    Robert et al.
2009/0223276 A1    9/2009    Rudolf et al.
2011/0219875 A1    9/2011    Walther et al.

FOREIGN PATENT DOCUMENTS

| EP | 2 065 713 A1 | 6/2009 |
| EP | 2 098 823 A1 | 9/2009 |
| FR | 2 842 914 | 1/2004 |
| FR | 2 917 731 | 12/2008 |

OTHER PUBLICATIONS

U.S. Appl. No. 13/459,618, filed Apr. 30, 2012, Walther et al.
French Preliminary Search Report issued Nov. 17, 2010, in Patent Application No. 1051831 (with English translation of Category of Cited Documents).
Cenk Acar, et al., "Experimental evaluation and comparative analysis of commercial variable-capacitance MEMS accelerometers", Journal of Micromechanics and Microengineering, vol. 13, 2003, pp. 634-645.
Alvin Barlian, et al., "Review: Semiconductor Piezoresistance for Microsystems", Proceedings of the IEEE, vol. 97, No. 3, Mar. 2009, pp. 513-552.
E. Jesper Eklund, et al., "Single-mask fabrication of high-G piezoresistive accelerometers with extended temperature range", Journal of Micromechanics and Microengineering, vol. 17, 2007, pp. 730-736.
R. Neul, et al., "Micromachined Gyros for Automotive Applications", IEEE, 2005, pp. 527-530.
Aaron Partridge, et al, "A High-Performance Planar Piezoresistive Accelerometer", Journal of Microelectromechanical Systems, vol. 9, No. 1, Mar. 2000, pp. 58-66.
George Juraj Stein, "Some Recent Developments in Acceleration Sensors", Measurement Science Review, vol. 1, No. 1, 2001, pp. 183-186.
U.S. Appl. No. 13/045,934, filed Mar. 11, 2011, Walther et al.
U.S. Appl. No. 13/722,427, filed Dec. 20, 2012, Walther.

* cited by examiner

FORCE SENSOR WITH REDUCED NOISE

TECHNICAL FIELD AND BACKGROUND OF THE INVENTION

The present invention relates to a MEMS or NEMS sensor with reduced noise.

The field of the invention is in particular that of body or surface force micro/nano-sensors working remotely, in particular inertial micro/nano-sensors, and more specifically accelerometers, or magnetic or electrostatic force sensors.

MEMS (microelectromechanical systems) or NEMS (nanoelectromechanical systems) accelerometers comprise a suspended seismic mass set in motion under the effect of an acceleration. "Piezoresistive" accelerometers also comprise a piezoresistive gauge sensitive to the movements of the mass and making it possible, by varying the resistivity, to determine the acceleration.

Document US 2007/0084041 describes an accelerometer implementing piezoresistive gauges, in which the mobile mass is suspended at the end of a clamped beam constituting a pivot link and the gauges extend parallel to the beam and are deformed during movement of the mass. This structure makes it possible to benefit from a lever arm effect, the force exerted on the piezoelectric gauges is then amplified relative to the force undergone by the suspended mass due to the acceleration by a factor dependent on the geometry of the system.

Accelerometers with piezoresistive gauges have the advantages of being inexpensive and easy to implement, and of requiring simple processing electronics. Nevertheless, they are difficult to use at low frequencies. Indeed, one type of noise, called 1/f, is predominant at low frequencies in the piezoresistive gauges and causes a very noisy response at low frequencies and bias drifts that are incompatible with certain applications. This is why, in many cases, capacitive accelerometers are preferred.

The noise mentioned above is called "1/f" because its spectral density is inversely proportional to the frequency.

The sources of noise in an accelerometer with detection by piezoresistive gauge are:
Brownian noise,
Johnson noise,
1/f noise, and
noise due to the measuring electronics.

The predominant noise in piezoresistive accelerometers is 1/f noise, because it is integrated on a bandwidth close to the zero frequency.

1/f noise can limit the resolution. It can also create a bias drift.

In the document A. Barlian, "*Review: Semiconductor Piezoresistance for Microsystems*", *Proceedings of the IEEE*, vol 97 (3), p 513-552, 2009, it is mentioned that the 1/f noise of the accelerometers can be reduced by acting on the parameters of the production method, such as the doping or the annealing temperature.

BRIEF DESCRIPTION OF THE INVENTION

It is therefore one aim of the present invention to offer a MEMS or NEMS sensor, for example a piezoresistive accelerometer in which the 1/f noise is reduced.

The previously stated aim is achieved by a sensor comprising a mass that is mobile around a pivot link, means for detecting the movement of the mobile mass, the mobile mass being in two parts, one of the parts being moved at high frequency relative to the other part, causing a high-frequency variation of the distance between the axis of the pivot link and the center of gravity of the part moved at high frequency, which makes it possible to reduce the 1/f noise.

Indeed, the 1/f noise, which has a spectral density inversely proportional to the frequency, is due to a fluctuation of conductivity in the resistances. It is expressed as follows:

$$V_{1/f}^2 = V_b^2 \frac{\alpha}{Nf} \text{ (in V}^2\text{/Hz)}$$

where Vb designates the supply voltage of the resistance, $\alpha$ is a phenomenological coefficient called Hooge's coefficient, and N is the number of charge carriers in the resistance; this noise is therefore more critical as the volume of the resistance is smaller.

The acceleration varies slowly at a frequency typically below 100 Hz. By making, within the mobile mass, a part that it set in motion under the effect of a high-frequency excitation, it is possible to generate a high-frequency signal, in addition to the low frequency signal. This high frequency signal then makes it possible to reduce the 1/f noise, which can then no longer be limiting for the resolution of the sensor.

In other words, a composite mobile mass is used whereof one part is excitable at high frequency, the oscillator is then excited by a traditional quasi-static component and a dynamic component.

The force sensor according to the invention therefore comprises at least one released mass having a degree of freedom in the direction of the force to be measured and connected to a fixed part by at least one pivot. The released mass comprises at least one part that is mobile relative to the rest of the mass and connected to the latter by at least one suspension element so as to allow a movement of the mobile part in a different direction from that of the force to be measured. The sensor also comprises high frequency excitation means for said mobile part, and means for detecting said force.

The structure of the mobile part depends on the force one wishes to measure; it can be a mass in the case of acceleration forces, or a mass made completely or partly from a magnetic material in the case of magnetic forces. It is preferable for the "members"/materials sensitive to the force one wishes to measure to be located on the part in motion at high frequency. They can also be located on the other part.

The dimensioning of the mobile part of the mass and the at least one suspension element is such that the mobile part, by moving, causes a movement of the center of gravity, which causes a modulation of the signal due to the force to be measured, detected at the movement frequency of said mobile part, this modulation corresponding to a dynamic component of the force.

The sensor is advantageously an accelerometer with in-plane piezoresistive detection or out-of-plane detection.

The subject-matter of the present invention is then a microelectromechanical or nanoelectromechanical detection device for detecting a force in a given direction, comprising a support and at least one seismic mass capable of moving under the effect of the force to be measured in the direction of said force, and means for detecting the movement of said seismic mass, said seismic mass being articulated relative to the support by at least one pivot link, and means or actuators capable of varying the distance between the axis of the pivot link and the center of gravity of the exertion of the force on said seismic mass.

"Center of gravity of the exertion of the force" refers to the center of gravity of the sensitive part of the mass with regard to the force one wishes to measure. Generally, this center corresponds to the center of gravity of the mass, but in certain cases, in particular when the mass is heterogeneous, for example in the case of magnetic force sensors, this center can be different from that of the mass.

Advantageously, the means for varying the distance are capable of making it vary at high frequency.

Said seismic mass preferably comprises at least first and second parts able to move relative to each other, and the means comprise excitation means able to move the second part of the seismic mass relative to the first part of the seismic mass in a direction different from that of the force to be measured, called excitation axis.

The excitation frequency of the excitation means is for example in the vicinity of several kHz.

In one example embodiment, the excitation means are arranged between the first and the second part and are exerted on the second part.

In another example embodiment, the excitation means are arranged between the support and the second part and are exerted on the second part via an intermediate seismic mass capable of moving only along the excitation axis.

For example, the excitation means are of the electrostatic, piezoelectric, or magnetic type, and the detection means are of the capacitive, piezoelectric, magnetic, piezoresistive, frequency, etc. type. The detection means can comprise at least one piezoresistive gauge, and advantageously two piezoresistive gauges arranged on either side of the axis of the pivot link.

In one embodiment, the second part of the seismic mass is capable of moving in a plane of the seismic mass, the suspension means being formed by at least one spring deforming in the plane.

In another embodiment, the second part of the seismic mass has a movement outside the plane of the seismic mass, the suspension means being formed by at least one spring deforming out of plane.

The spring can be formed by a beam or a set of beams.

The first part forms, for example, a frame inside which the second part is suspended.

The detection device can comprise two seismic masses each comprising a first part and a second part connected to each other and mobile relative to each other, the first parts being rigidly connected by an arm, the pivot connection being done on the arm, and the detection means detecting the movement of said arm, the two second mobile parts moving in phase relative to each other.

The detection device can, in another example embodiment, comprise a seismic mass having at least first and second parts mobile relative to each other, the pivot link being made on the first part, the excitation means being arranged between the support and the second part and being exerted thereon via an intermediate seismic mass capable of moving only along the excitation axis, said two parts being arranged relative to each other so that the axis cutting the axis of the pivot link and passing through the center of gravity of the mass, in the absence of excitation, is perpendicular to the direction of the force to be detected.

Moreover, the at least one seismic mass can be suspended by a beam, the axis of the pivot link being substantially orthogonal to the device plane.

The mechanical connection between the piezoresistive gauge(s) and the seismic mass is advantageously situated on or as close as possible to the plane containing the center of gravity and the axis of the pivot link.

In one alternative embodiment, the seismic mass is suspended by a torque shaft whereof the axis is contained in the plane.

When the axis of the pivot link is included in the plane, the gauge is offset along a direction orthogonal to the plane relative to said axis in the case of a piezoresistive detection.

The detection device can comprise counter-reaction electrodes and/or electrodes for adjusting the resonance frequency.

The subject-matter of the present invention is also an accelerometer formed by a force measuring device according to the present invention.

The accelerometer can comprise electrodes for compensating quadrature bias of a type known from the state of the art, on which a direct voltage and an alternating voltage are applied, said alternating voltage being at a frequency that is twice the excitation frequency.

The accelerometer can advantageously be implemented in vacuum.

This type of sensor, using a piezoresistive detection or another type of detection mode, also has the advantage of being more robust to vibrations from the environment (e.g. in a car), since the sensor operates at a frequency at which the intensity of the parasitic vibrations of the environment is potentially low. Another advantage is that this sensor can operate under vacuum with electronics identical to those of a gyroscope and therefore in the event one wishes to integrate both MEMS gyroscopes and accelerometers in a same inertial unit, the use of the accelerometers of the present invention makes it possible to be able to vacuum "package" them at the same time as the gyroscopes and to use identical electronics, for example the same electronics that measure the signal of each sensor one after the other in the case of temporal multiplexing.

BRIEF DESCRIPTION OF THE DRAWINGS

The present invention will be better understood using the following description and the appended drawings, in which.

DETAILED DESCRIPTION OF THE INVENTION

In the following description, the detection devices described are, as an example, accelerometers, but they are in no case limiting, the detection devices according to the present invention being able to make it possible to measure other sizes, such as magnetic forces.

Figure 1A:
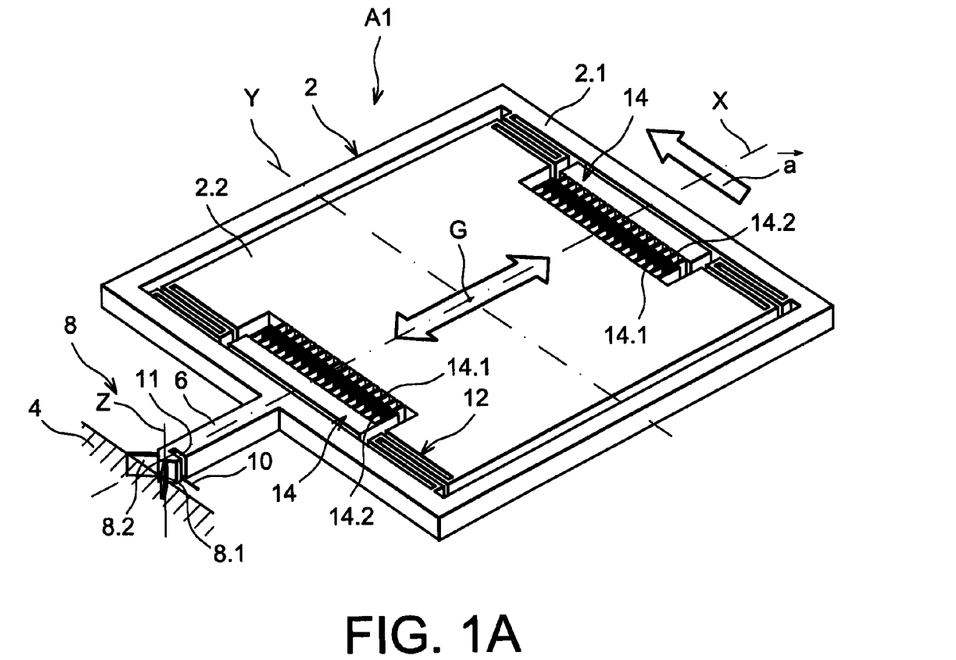
FIG. 1A is a perspective top view of an embodiment of a detection device according to the present invention in the case of in-plane excitation and in-plane detection.

FIG. 1A shows an embodiment of an accelerometer A1 in the plane, the sensitive axis of which is designated by Y, i.e. the direction of the acceleration to be measured, which is symbolized by the arrow designated $\vec{a}$. Direction X designates the excitation direction that will be described later. In the illustrated example, directions X and Y are perpendicular and define the detection plane of the detection device.

The accelerometer A1 comprises a mass 2 suspended from a support 4 by an arm 6, whereof the center of gravity is designated G.

The arm 6 is connected to the support 4 via a hinge 8 forming a pivot connection with axis Z orthogonal to the plane XY.

The mass 2 is intended to be set in motion by the acceleration and to move along the direction Y around the pivot Z.

In the illustrated example, the hinge is formed by two beams 8.1 and 8.2 that are flexible in the plane, fixed by one end on the support 4 in two separate places and by another end on the arm 6 at a shared point and defining the pivot axis Z at the shared attachment point of the arm 6. This configuration has the advantageous effect of obtaining a pure or practically pure rotation of the mass 2 around axis Z.

The detection device also comprises means for detecting the movement of the mass 2. In the illustrated example, the detection means 10 are formed by a piezoresistive gauge whereof one end is mechanically connected to the arm 6 and the other is mechanically connected to the support 4.

In the illustrated example, the piezoresistive gauge 10 is parallel to the direction Y of the acceleration to be measured. Other configurations can make it possible to place the gauge parallel to axis X.

The accelerometer A1 is not very sensitive to transverse movements, i.e. movements along a direction orthogonal to the direction Y, because they apply a bending stress to the gauge 10, to which the gauge 10 is not very sensitive.

Furthermore, the accelerometer is also not very sensitive to the temperature, because in case of expansion of the arm, it also applies a bending stress to the gauge 10, to which it is not sensitive.

Figure 1B:
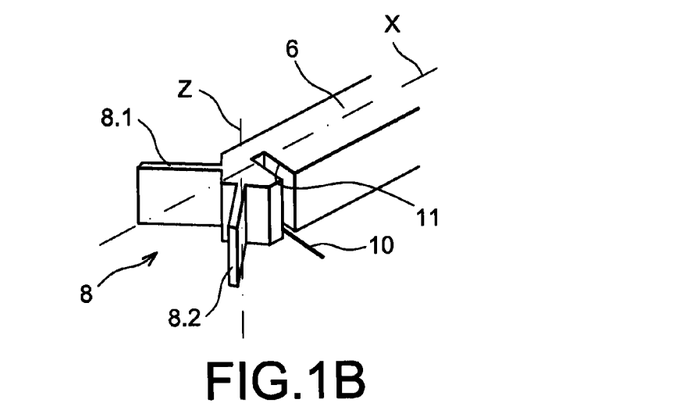
FIG. 1B is a detailed view of FIG. 1A.

Particularly advantageously, the arm comprises a lateral recess 11 such that the gauge is connected to the arm on the axis passing through the pivot axis Z and the center of gravity G of the seismic mass 2. This configuration has the advantage that: all or nearly all of the intensity of the stress applied by the movement of the seismic mass 2 participates in the deformation along the Y axis of the strain gauge 10. Indeed, when the anchoring of the gauge 10 is offset relative to the axis passing through the pivot connection and the center of gravity G, as is the case in the first embodiment, part of the deformation stress exerts a bending stress on the gauge combined with a compression or traction stress. However, this bending stress participates very little or not at all in the variation of the electrical resistance of the piezoresistive gauge 10.

The mobile mass 2 comprises first and second parts 2.1, 2.2 capable of being moved relative to each other.

In the illustrated example, the first part 2.1 forms a frame on which the arm 6 is fixed, and the second part 2.2 is arranged inside the frame 2.1. The second part 2.2 is suspended from the frame 2.1 via elastic suspension means 12 capable of deforming in direction X to allow the second part 2.2 to move along direction X and returning it to the idle position, centered in the frame 2.1.

In the illustrated example, the center of gravity of the second part 2.2 is combined with that of the mass 2. For simplification, the center of gravity of the second part will also be designated G. However, the present invention is applicable to any system in which the center of gravity of the mass and that of the mobile part are not combined.

In the illustrated example, the elastic means are formed by four springs arranged in the four corners of the mobile part 2.2 and made directly in the plate forming the mobile mass 2.

The accelerometer A1 also comprises means 14 for setting the second part 2.2 in motion relative to the frame 2.1 along direction X. In the rest of the description, these means 14 will be referred to as "excitation means" and the second part 2.2 will be referred to as "mobile part 2.2." Play is therefore provided between the mobile part 2.2 and the frame 2.1, in particular between the ends along the X axis of the mobile part 2.2 and the faces opposite the frame 2.1.

The excitation means 14 set the mobile part 2.2 in motion at a high frequency (i.e. a frequency substantially higher than the bandwidth of the sensor, the bandwidth being the maximum frequency of the signal that one wishes to measure), for example in the vicinity of a few kHz.

In the illustrated example, the excitation means 14 are of the electrostatic type. The mobile part 2.2 comprises, at each of its ends in direction X, protruding fingers 14.1 that are interdigital with the fingers 14.2 made in the faces opposite the anchored part of 14. The application of a voltage between the mobile part and the excitation means 14 causes the mobile part 2.2 to move relative to the frame 2.1 along the X axis. In this embodiment, the frame 2.1 does not move along X; it is in fact retained by the hinge. Any other adapted excitation means can be implemented, such as piezoelectric, magnetic, etc. excitation means.

The movement of the mobile part 2.2 in the frame 2.1 causes a modification of the position of the center of gravity of the mobile part, which is, in the illustrated example, combined with that G of the mass.

The accelerometer A1 also comprises electronic means (not shown) for controlling the excitation means 14 on one hand, and for processing the resistance variations of the piezoresistive gauge and converting those variations into acceleration values on the other hand. Moreover, means (not shown) for applying direct or alternating voltage to the gauge, and for measuring a current variation circulating in the gauge and processing the current variation measurements are associated with the accelerometer A1. The gauge can also be incorporated into a Wheatstone bridge whereof the output voltage is proportional to the relative resistance variation of the gauge.

We will now explain the operation of the accelerometer.

The accelerometer is fixed on an object whereof one wishes to measure the acceleration, for example an automobile, the accelerometer being oriented so that its Y axis is parallel to the direction of the acceleration to be measured $\vec{a}$.

When the object is subject to an acceleration $\vec{a}$, the accelerometer also sees this acceleration $\vec{a}$, it then causes the mobile mass 2 to move in direction Y, i.e. the mass oscillates around the pivot axis Z.

In the accelerometers of the state of the art, the force exerted by the acceleration on the piezoresistive gauge is written:

$$F = ma\frac{L_g}{d}$$

with:
F the force exerted on the piezoresistive gauge 10;
m the mass of the mobile mass 2,
a the acceleration,
$L_g$ the distance between the center of gravity of the mobile part, which is designated G, and the pivot axis Z,
d the distance between the pivot axis Z and the anchoring point of the piezoresistive gauge on the arm 6.

The position of the center of gravity of the second part 2.2 varying along the X axis, the distance $L_g$ varies during the measurement; it therefore has a static component $L_0$ corresponding to the distance between the center of gravity G and the pivot axis Z at rest and a dynamic component designated x that represents the amplitude of the movement of the mobile part 2.2.

The seismic mass is then equivalent to two oscillators: the first, called to be in excitation, comprises the mobile part 2.2 in motion along X and retained by the springs 12, the second, called to be in detection, comprises the part 2.1 of the mobile mass 2 in motion along Y and retained by springs formed by the pivot 8 and the gauge 10.

The oscillator in the detection direction Y is therefore excited by a quasi-static component proportional to $L_0$ and a high-frequency component proportional to x and that is amplified by the transfer function of the oscillation in detection.

The gauge is subjected to a quasi-static force $$F_0 = ma\frac{L_0}{d},$$

and to a dynamic force designated $F^{fexc}$ that can be written:

$$F^{fexc} = \frac{m_{2.2}a\frac{x}{d}}{\sqrt{\left(1 - \left(\frac{f_{exc}}{f_{det}}\right)^2\right)^2 + \left(\frac{f_{exc}}{Q_{det}f_{det}}\right)^2}}$$

with $m_{2.2}$ the mass of the mobile mass 2.2, $f_{exc}$, the frequency of the movement of the oscillator in excitation, which is preferably excited at its resonance frequency, $f_{det}$ the resonance frequency of the oscillator in detection, and $Q_{det}$ the quality factor of the oscillator in detection.

The force $F^{fexc}$ therefore forms a high frequency signal for the electronic means, which makes it possible to reduce the 1/f noise of the accelerometer.

Indeed, the 1/f noise, which has a spectral density inversely proportional to the frequency, is due to a conductivity fluctuation in the resistances. It is expressed as follows:

$$V_{1/f}^2 = V_b^2 \frac{\alpha}{Nf} \text{ (in V}^2\text{/Hz)}$$

with:
Vb the supply voltage of the resistance,
α a phenomenological coefficient called Hooge's coefficient,
N the number of charge carriers in the resistance.

Owing to the high frequency signal obtained by implementing a mobile part 2.2 in the mobile mass 2, the impact of the 1/f noise is reduced.

In the case of an accelerometer of the state of the art, which uses a quasi-static signal, the noise is integrated on a low-frequency frequency range:

$$V_{noise\_quasistat}^2 = \int_{f_0}^{BP} V_b^2 \frac{\alpha}{Nf} df$$

with $f_0$ a minimum frequency substantially below 1 Hz and BP the bandwidth of the sensor (maximum frequency of the acceleration one wishes to measure).

In the case of an accelerometer according to the present invention, the signal is integrated at high frequency between the frequency $f_{exc}$ and $f_{exc}$+BP:

$$V_{noise\_dynamique}^2 = \int_{fexc}^{fexc+BP} V_b^2 \frac{\alpha}{Nf} df$$

We then clearly have $V_{noise\_quasistat}^2 >> V_{noise\_dynamique}$

Figure 2A:
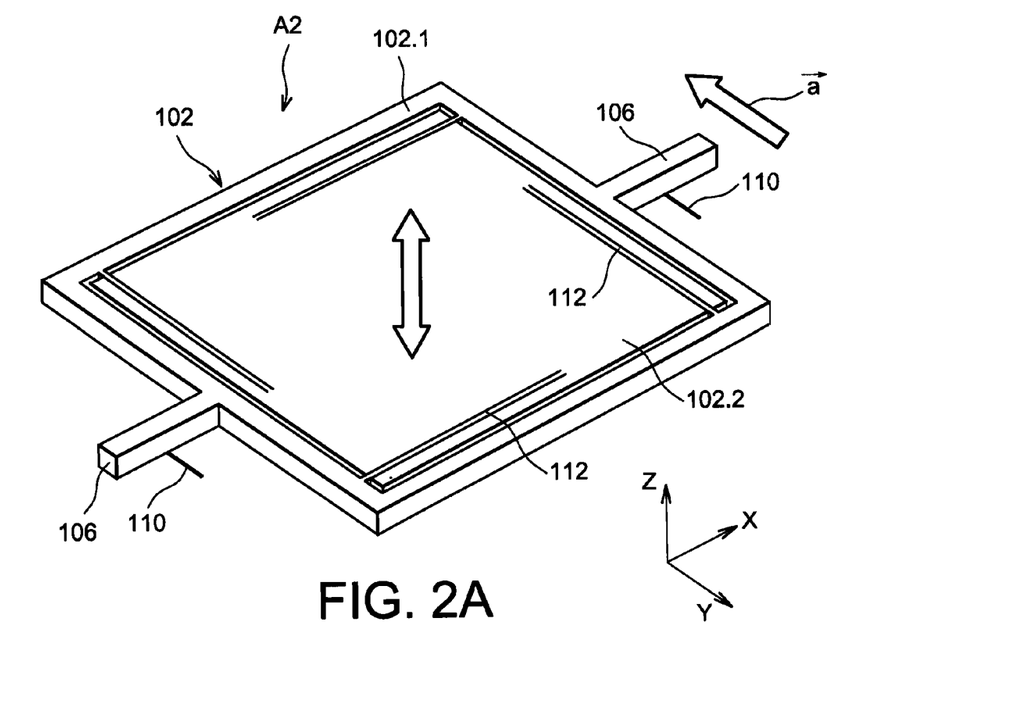
FIG. 2A is a perspective top view of another embodiment of a detection device according to the present invention in the case of out-of-plane excitation and in-plane detection.
Figure 2B:
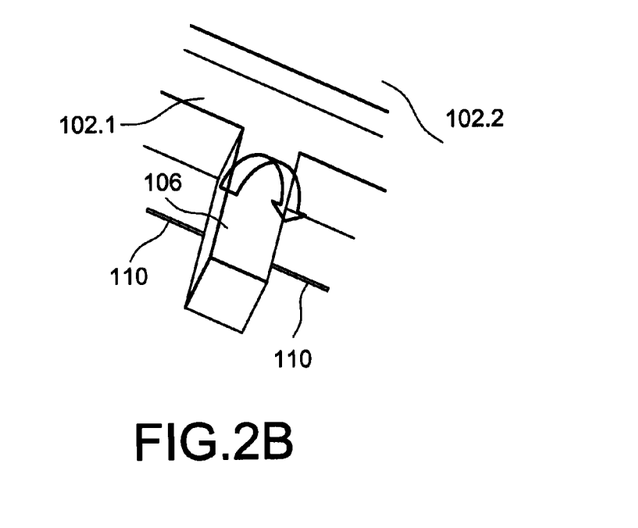
FIG. 2B is a detail view of the sensor of FIG. 2A.

FIGS. 2A and 2B show another embodiment of an in-plane accelerometer A2.

In this embodiment, the mobile mass is suspended using two torsion arms 106 aligned along the X axis and therefore perpendicular to the sensitive Y axis.

Moreover, the mobile part 102.2 is mobile in direction Z, i.e. out-of-plane and not along direction X. To that end, the elastic suspension means 112 have been modified relative to those 12 of the example of FIG. 1A, so as to allow the out-of-plane movements and exert a return force on the mobile part 102.2 towards the idle position. The elastic suspension means 112 are for example formed by four beams each connected by one end to an inner face of the frame 102.1 and by another end to the mobile mass 102.2 and working in bending. In the illustrated example, the frame 102.1 and the mobile part 102.2 are a single piece and the beams are etched into the mobile part 102.2. In the mobile part 102.2, each beam is perpendicular to the directly adjacent beams.

As shown in FIG. 2A, the piezoresistive gauges 110 are attached by one end to an anchor and by another end to the torsion arms 106 perpendicular to their axis and in a plane not containing their torsion axis so as to be effectively deformed, when the mobile mass 102 is set in motion and causes the torsion of the beams 106 in the presence of an acceleration force along Y. Two gauges 110 are fixed on each torsion arm 106 on two opposite faces, both deformed by the rotation of the mobile mass 102.1.

The two gauges 110 are advantageously mounted differentially, which advantageously makes it possible to do away with the effect of the temperature variations.

The differential mounting of two gauges can be implemented in all of the embodiments.

As for the example of FIG. 1A, means for exciting the mobile part 102.2 along the Z axis (not shown), relative to the frame 102.1, are provided.

When the mobile part 102.2 of the mobile mass 102 is idle, the center of gravity of the mobile part 102.2 and therefore that of the mobile mass 102, in the illustrated example, is situated on the torsion axis and therefore does not deform the arms 106 in torsion. When the mobile part 102.1 is set in motion along the Z axis by the excitation means, the center of gravity G is offset upwards or downwards in the illustration of FIG. 2A, and the force generated by an acceleration causes a torsion of the torsion arms 106 and therefore a strain in the gauges.

The gauges 110 are then subjected to a quasi-static signal and a high frequency dynamic signal, which makes it possible to reduce the impact of the 1/f noise. By sufficiently reducing its impact, this can then no longer limit the resolution of the accelerometer.

Figure 3:
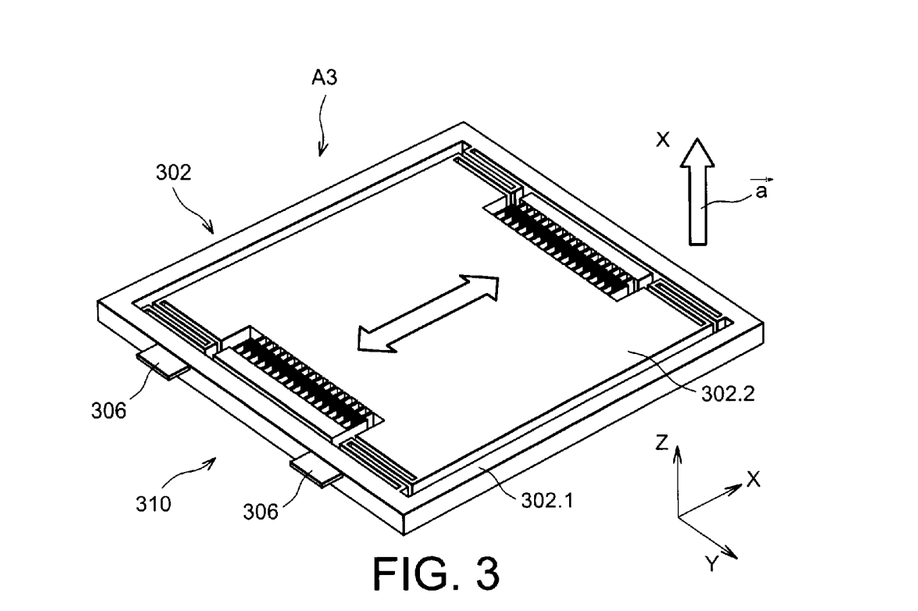
FIG. 3 is a perspective top view of an embodiment of a detection device according to the present invention in the case of out-of-plane detection and in-plane excitation.

FIG. 3 shows an embodiment of an out-of-plane accelerometer A3 making it possible to measure the Z axis acceleration; the sensitive axis of the accelerometer A3 is therefore the Z axis perpendicular to the plane of the mobile mass 302.

The structure of the accelerometer A3 is very close to that of the accelerometer A1; it differs from the latter in that the mobile mass is suspended from the support via Y-axis hinges 306.

A gauge 310 is provided and its anchoring to the mass 302 is offset along Z relative to the pivot axis Y formed by the hinges 306.

The mobile part 302.2 is excited in the plane.

The operation is similar to that of the accelerometer A1 and will not be repeated.

Figure 4:
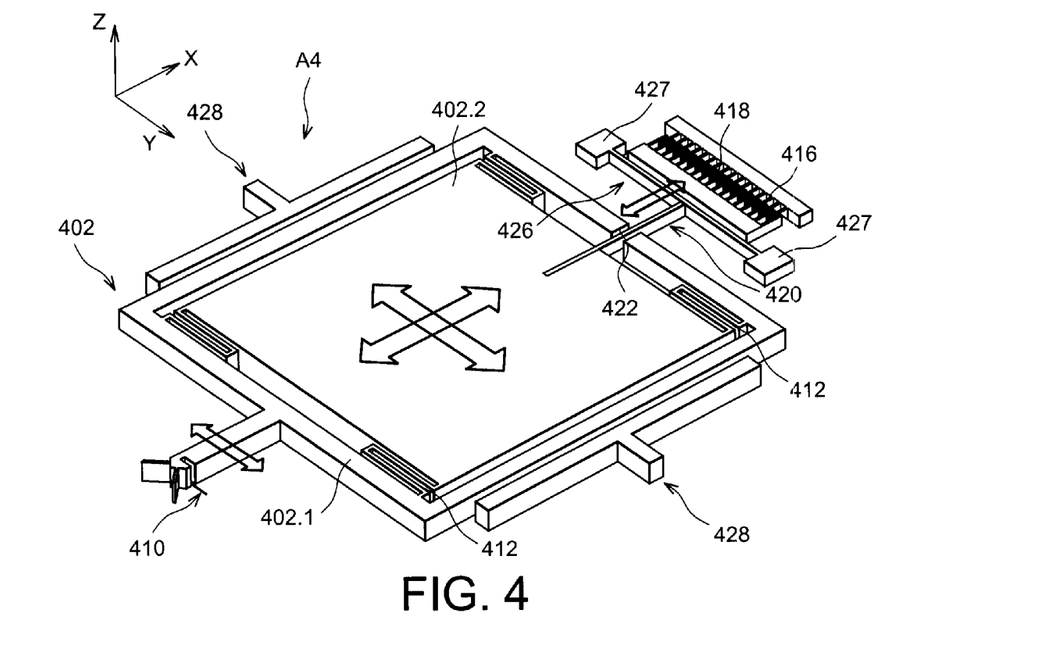
FIG. 4 is a perspective top view of an embodiment of the detection device of FIG. 1 provided with counter-reaction electrodes.

FIG. 4 shows another embodiment of an accelerometer A4.

The accelerometer A4 is an in-plane accelerometer, which structure is close to that of the accelerometer A1. The accelerometer A4 differs from the accelerometer A1 in that the excitation means 414 of the mobile part no longer set the mass 402.2 in motion directly, but set in motion a part 418, called intermediate seismic mass, separate from the mass 402.2 that can only move along the excitation direction X, this excitation movement along X being transmitted to the mass 402.2 via the beam 420. This makes it possible to mechanically separate the excitation and the detection. The excitation means 414 then no longer risk disrupting the movement of the frame 402 in the detection direction.

To that end, the excitation means 414 comprise two interdigital combs 416, 418, one of the combs 416 is fixed on the support, the other comb 418 is secured to the mobile part 402.2 and is connected thereto by a connecting arm 420 with axis X. The frame 402.1 comprises an opening 422 for the passage of the connecting arm 420.

The mobile part 402.2 is suspended in the frame 402.1 by means 412.

Moreover, return means 424 are provided between the intermediate seismic mass 418 and the support, for example formed by two beams 426 anchored by one end on pads 427 of the support and fixed by another end on a lateral face of the intermediate seismic mass 418. The return means 424 have the characteristic of being deformable in the excitation direction X and rigid in the other directions.

Advantageously, the resonance frequencies $f_{exc}$ and $f_{det}$ of the excitation and detection oscillators can be assigned to maximize the sensitivity of the accelerometer. In that case, the high frequency force undergone by the gauges 10 is written:

$$F^{fexc} = m_{2.2} a \frac{x}{f} Q_{det}$$

In the illustrated example, the accelerometer A4 also comprises electrodes 428, which can be counter-reaction electrodes or trimming electrodes, arranged on either side of the mobile mass relative to the X axis.

In the case of trimming electrodes, they make it possible to introduce a negative stiffness lowering the natural frequency of the detection oscillator; the stiffness thus introduced is proportional to the square of the static voltage applied on said electrodes.

The structure can be subjugated in detection in the event the electrodes 428 are counter-reaction electrodes. By applying an alternating voltage, a so-called counter-reaction force is generated, which has a value opposite the acceleration force undergone by the mass 402 and thus, the mass 402 is controlled in its equilibrium position. The controlled operation of the sensor makes it possible to improve the linearity of the measurement and the linear domain of the sensor no longer depends on the linearity of the measuring means, but on the maximum force that can be generated by the counter-reaction electrodes, which depends on the maximum voltage that can be applied to the electrodes and the dimensions of the electrodes.

Figure 5A:
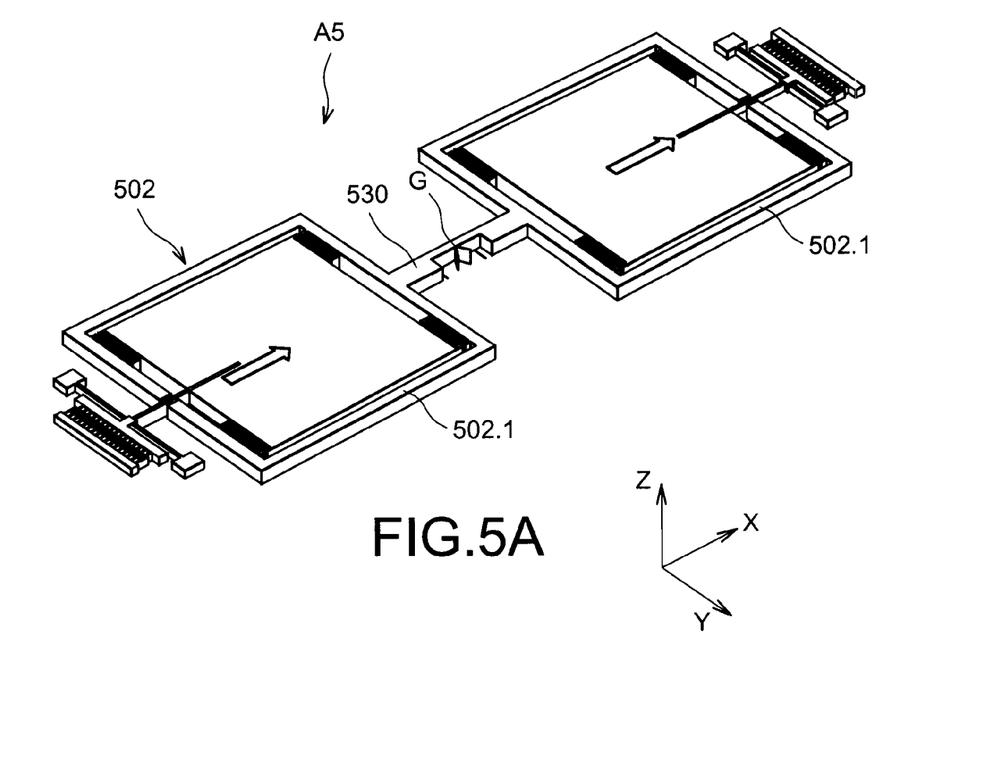
FIG. 5A is a perspective top view of an embodiment of a detection device according to the present invention robust to the Coriolis force and the effects of the quasi-static component of the acceleration.
Figure 5B:
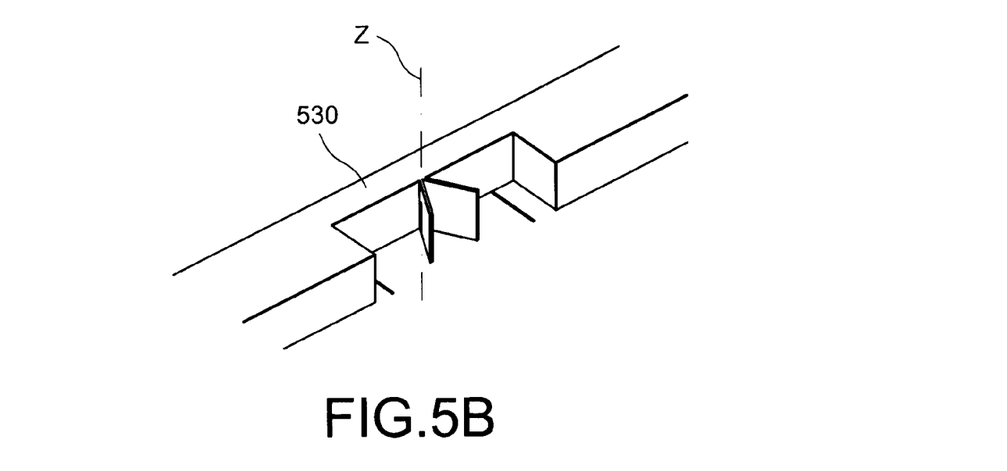
FIG. 5B is a detailed view of the detection device of FIG. 5A.

FIGS. 5A and 5B show another example of an accelerometer A5 that is not very influenced by the Coriolis force and by the quasi-static component of the acceleration.

The accelerometer A5 comprises two mobile masses 502. In the illustrated example, the accelerometer A5 is formed by two structures close to that of the accelerometer A4, the two masses 502 being rigidly connected to each other.

In the illustrated example, the frames 502.1 are connected by a connecting arm on which the hinge with axis Z is made, which is particularly visible in FIG. 5B. The accelerometer also comprises piezoresistive gauges 510 fixed by one end to the connecting shaft 530 on either side of axis Z.

As shown, the pivot axis Z is situated close to the structure's center of gravity G. As a result, the accelerometer A5 has a structure that is balanced at rest, which makes it not very sensitive to the quasi-static component of the acceleration. Furthermore, the two excitation oscillators are actuated in phase, and, in the event the sensor is subject to rotation, the Coriolis forces $\vec{F}_{Coriolis} = 2m\vec{v} \times \vec{\Omega}$ that result on each mass offset each other. This structure advantageously makes it possible to do away with the quasi-static component of the acceleration, and therefore to simplify the electronic processing means. Indeed, in the case of accelerometers A1 to A4, the gauges, and more generally the detection means, always undergo a quasi-static force due to the quasi-static contribution of the force due to the acceleration. This contribution is at a different frequency from the high frequency signal obtained owing to the present invention. In the case of a response by the detection means that is not completely linear, the high frequency response can be influenced by the strain exerted on the gauge at low frequency and make the measurements less reliable. Owing to the balanced structure of the accelerometer A5, this influence is eliminated.

It can be provided to make balanced accelerometer structures comprising a single mobile excitation part and a single detection mass.

Counter-reaction systems, such as the electrodes previously cited, and for compensating the quadrature bias, can be provided. These are known by those skilled in the art and will not be described in detail. It should be noted that in the detection devices according to the present invention, the quadrature compensation is done through the application of a direct voltage and an alternating voltage whereof the frequency is twice the excitation frequency rather that applying only a direct voltage as in the gyroscopes of the state of the art.

Figures 6A, 6B:
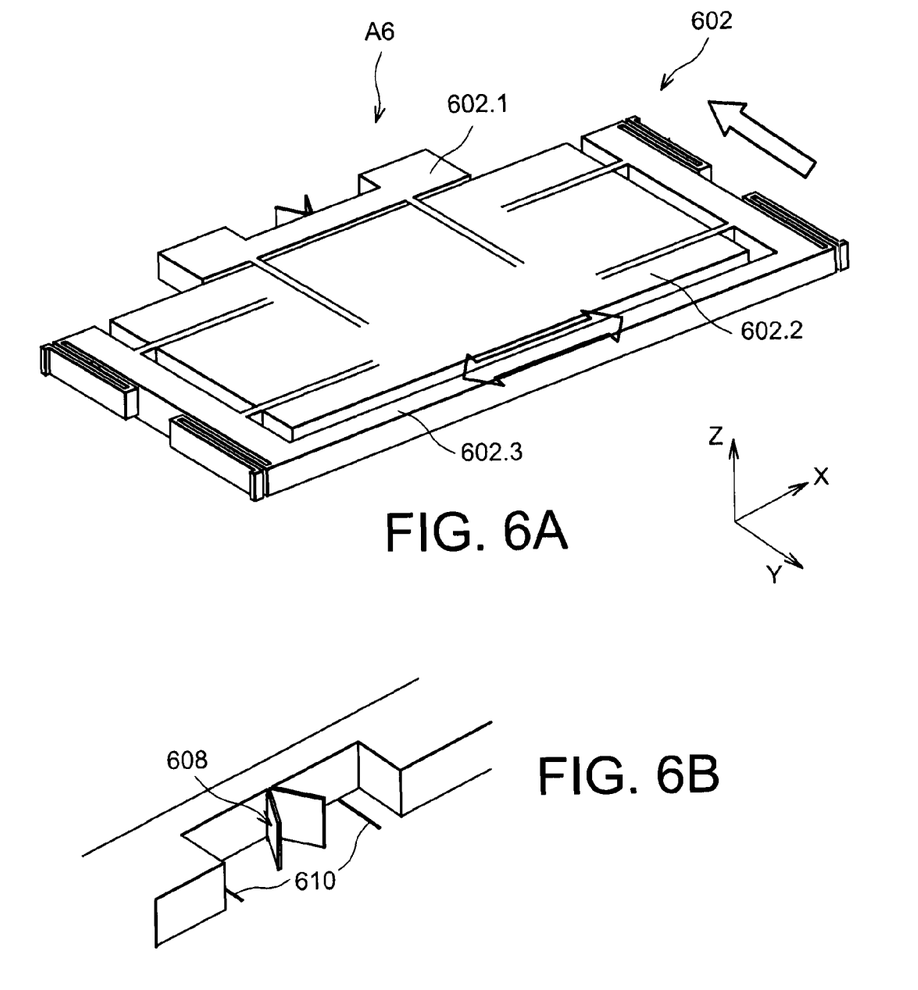
FIG. 6A is a perspective top view of a compact detection device according to the present invention, also robust to the Coriolis force and the effects of the quasi-static component of the acceleration.
FIG. 6B is a detailed view of the detection device of FIG. 6A.

FIGS. 6A and 6B show another embodiment of an accelerometer A6 also offering a balanced structure, and therefore having a certain robustness to the Coriolis force and the effects of the quasi-static component of the acceleration.

The accelerometer A6 comprises a mobile mass 602 with a substantially parallelepiped rectangle shape. The mass 602 is made up of a first part 602.1 hinged on the support via a hinge 608 with axis Z, a mobile part 602.2, and an intermediate part 602.3 forming an intermediate seismic mass.

The intermediate part 602.3 is in the shape of a U suspended by springs 612 at the two branches of the U, and surrounding the mobile part 602.2 on three sides.

The part 602.1 is only allowed to move in rotation around the hinge 608. The part 602.3 only moves in excitation along X, in a manner equivalent to the intermediate mass 418. It drives the second part 602.2 with it, which moves both in excitation (along X) and detection (rotation around Z).

The connections between the mobile part 602.2 and the first part 602.1, and between the intermediate part 602.3 and the mobile part 602.2 are formed by beams, the beams for example being etched directly into the mobile part.

The piezoresistive gauges 610 are fixed on either side of the hinge as shown in FIG. 6B.

Means (not shown) for exciting the mobile part in direction X are also provided.

The accelerometer A6 is more compact than structure A5, for example.

The structure, aside from its robustness to the Coriolis force and the effects of the quasi-static component of the acceleration, makes it possible to minimize the Brownian noise owing to the reduction of the lever arm between the mass and the pivot axis.

As an example, we will compare the noises and performances of an accelerometer of the state of the art and accelerometers according to the present invention.

Figure 7:
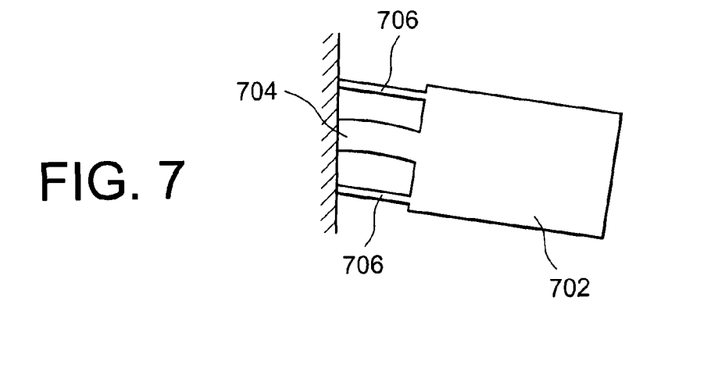
FIG. 7 is a top view of an accelerometer of the state of the art.

The accelerometer of the state of the art is for example that shown in FIG. 7, comprising a monolithic mobile mass 702 suspended by a flexible beam 704, excitation means of the mass acting on the beam 704, and piezoresistive detection means 706.

The sensitive mass has the following dimensions: 300 μm×200 μm×10 μm. The following hypotheses are also made:

bandwidth of 10 Hz,
Hooge's coefficient $\alpha=10^{-6}$,
doping $10^{19}$ impurities/cm$^{-3}$,
Vb=3V,
maximum strain on the gauge (defines the full scale) 100 MPa.
a resonance frequency of 5 kH, and
a quality factor of 50,000 for the resonant accelerometer.

|  | Accelerometer of the state of the art (FIG. 7) | Accelerometer according to the invention; frequencies assigned | Accelerometer according to the invention; frequencies not assigned |
|---|---|---|---|
| Brownian noise(V$^2$/Hz) | $8.55 \cdot 10^{-14}$ | $1.68 \cdot 10^{-13}$ | $3.44 \cdot 10^{-17}$ |
| Johnson noise (V$^2$/Hz) | $1.59 \cdot 10^{-16}$ | $2.65 \cdot 10^{-16}$ | $2 \cdot 10^{-16}$ |
| 1/f noise (V$^2$/Hz) | $6.91 \cdot 10^{-13}$ | $7.2 \cdot 10^{-17}$ | $9.6 \cdot 10^{-17}$ |
| Electronic noise (V$^2$/Hz) | $10^{-16}$ | $10^{-16}$ | $10^{-16}$ |
| Resolution (μg/√Hz) | 46 | 11 | 42 |
| Linear domain (g) | 11 | 2.8 | 214 |
| Resolution/linear domain for a bandwidth of 10 Hz | $4.2 \cdot 10^{-5}$ | $3.9 \cdot 10^{-5}$ | $2 \cdot 10^{-6}$ |

A significant decrease is seen in the 1/f noise, which is then no longer predominant in the case of an accelerometer according to the present invention with assigned frequencies, and the resolution is divided by 4. The Brownian noise then becomes predominant. In the case of an accelerometer according to the present invention with the frequencies not assigned, the resolution is practically identical to the accelerometer of the state of the art. However, a gain of a factor 20 is obtained on the full scale.

To decrease the Brownian noise, as indicated above, it is for example possible to reduce the lever arm.

The sensor can use detection means other than piezoresistive gauges, such as capacitive means, piezoelectric means, magnetic means, etc. even when the 1/f noise is not the dominant noise for said detection means.

Preferably, the accelerometers, and more generally the force sensors, are implemented under vacuum.

Advantageously, one or more accelerometers can be associated with one or more gyroscopes, in particular to reconstitute movement, the gyroscopes requiring operation under vacuum. Furthermore, the electronic means associated with the accelerometer and those associated with a gyroscope are relatively close; it is therefore possible to consider using the same electronic means that would alternatingly control one or more gyroscopes and one or more accelerometers.

Advantageously, the two parts of the mobile mass, the suspension means of the mobile part, of the mass on the support, the detection means, of the piezoresistive gauge type, are made in a single piece by deposition of layers and etching.

We will now describe such a method for producing an accelerometer, the various steps of which are diagrammatically illustrated in FIGS. 8A to 8F.

Figure 8A:
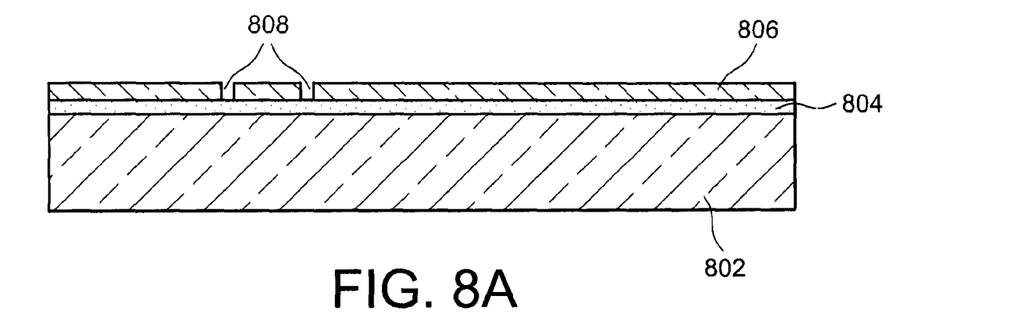
FIGS. 8A to 8F are diagrammatic illustrations of an example of a method for making a detection device according to the present invention.

For example, an SOI (Silicon on insulator) structure is used comprising a substrate 802, a buried oxide layer (BOX) 804, and a silicon layer 806. The silicon layer 806 for example has a thickness in the vicinity of 200 nm. In general, the layer 806 can be Si, SiGe, or poly- or mono-crystalline Ge.

A structuring is then done of the silicon layer 806, for example by photolithography and etching with a stop on the oxide layer 806, which makes it possible to define the piezoresistive gauge, as shown in FIG. 8A.

Figure 8B:
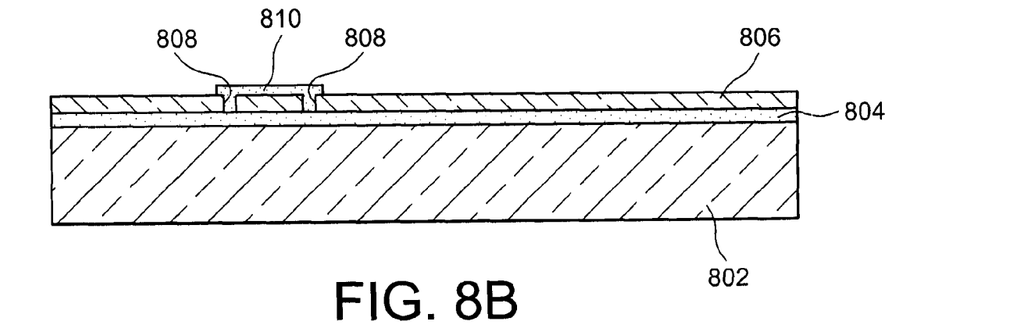

During a subsequent step shown in FIG. 8B, an oxide layer 810 is deposited on the silicon layer 806 to fill in the previously etched zones 808, then etching is done of the oxide layer 810 so as to allow only a portion of oxide deposited on the silicon layer 806 to remain and binding the oxide filling in the trenches. The etching can be done by dry etching with stop on Si or by wet etching, for example using a sulfuric acid-based solution.

Figure 8C:
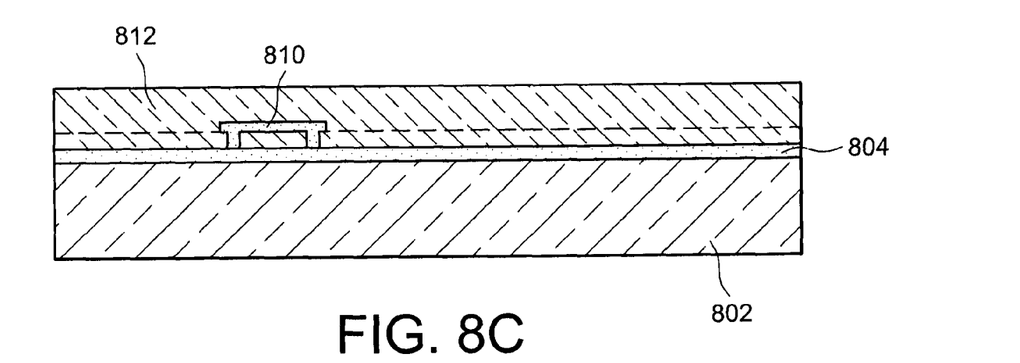

During a subsequent step shown in FIG. 8C, a deposition of a silicon layer 812 is formed. The layer 812 is for example obtained by epitaxial growth, and has a typical thickness from 1 to 50 μm, for example 10 μm. More generally, the layer 812 can be made of Si, SiGe, poly- or mono-crystalline Ge, or a metal material; the deposition can be done by epitaxy or by methods of the physical/chemical vapor deposition (PVD/CVD) type.

Figure 8D:
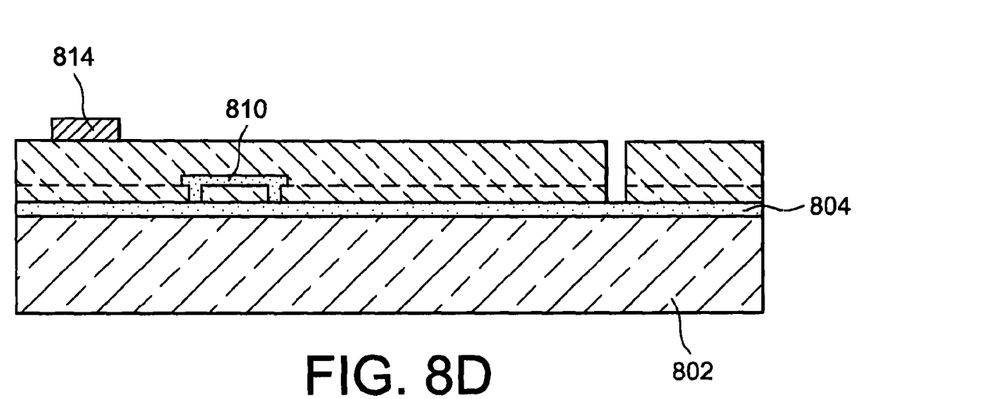

During a subsequent step illustrated in FIG. 8D, electrical contacts 814 are made. To that end, a metal layer (AlSi or Au, for example) is deposited, and the zones to be removed and kept by photolithography are identified. Dry etching with stop on Si or selective wet etching relative to the Si is then done to etch the metal layer so as to keep only the contacts 814.

Figure 8E:
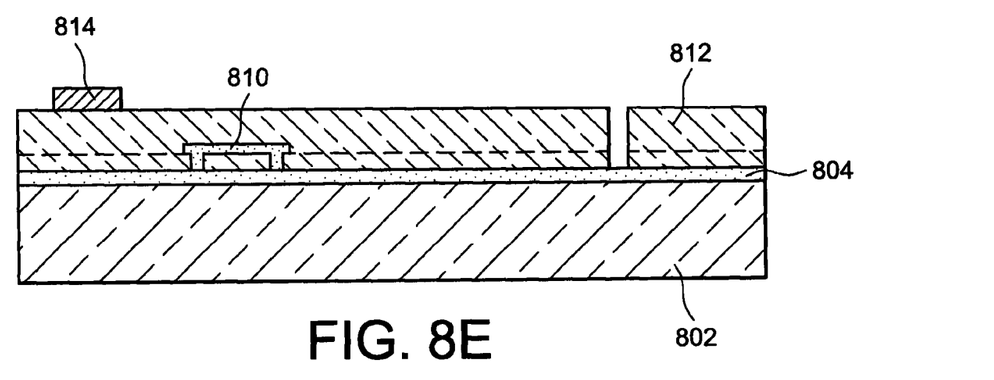

During a subsequent step shown in FIG. 8E, the silicon layers 806 and 812 are structured to define the mobile mass and the pivots, for example by photolithography and deep etching with stop on the oxide layer 804.

Figure 8F:
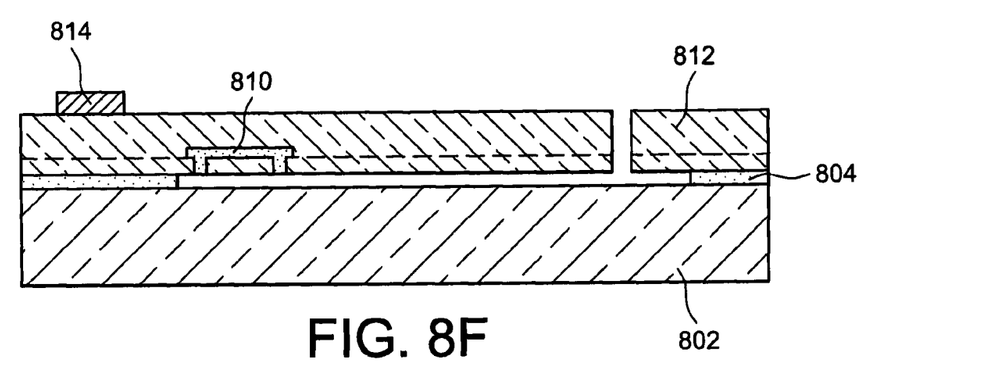

During a subsequent step illustrated in FIG. 8F, the mobile mass, the gauge and the pivots are released, for example by wet etching of the oxide 804, for instance using liquid hydrofluoric acid (HF) and/or vapor. This involves time etching. The hydrofluoric acid is left in contact with the oxide layer for the time needed to release the mobile mass, the gauge and the pivots while leaving the oxide layer between the substrate and the fixed parts.

The invention claimed is:

1. A microelectromechanical or nanoelec-tromechanical device for detecting a force following a given direction, comprising:
    a support,
    at least one seismic mass capable of moving under an effect of the force to be measured in the direction of said force, said mass comprising at least first part and second part able to move relative to each other,
    a detector for detecting the movement of said seismic mass, said seismic mass being articulated relative to the support by at least one pivot link, and
    an actuator capable of making a distance between an axis of the pivot link and the center of gravity of the exertion of the force on said seismic mass vary at high frequency, said actuator being capable of moving the second part of the seismic mass relative to the first part of the seismic mass in a direction different from that of the force to be measured, called excitation axis,
    wherein the device includes only one actuator for one seismic mass for the given direction of the force to be detected.

2. The microelectromechanical or nanoelec-tromechanical device according to claim 1, wherein the excitation frequency of the actuator is in the vicinity of several kHz.

3. The microelectromechanical or nanoelec-tromechanical device according to claim 1, wherein the actuator is arranged between the first part and second part and is exerted on the second part.

4. The microelectromechanical or nanoelec-tromechanical device according to claim 1, wherein the actuator is arranged between the support and the second part and is exerted on the second part via an intermediate seismic mass capable of moving only along the excitation axis.

5. The microelectromechanical or nanoelec-tromechanical device according to claim 1, wherein the actuator is of the electrostatic, piezoelectric, or magnetic type.

6. The microelectromechanical or nanoelec-tromechanical device according to claim 1, wherein the detector is a capacitive detector, a piezoelectric detector, a magnetic detector, a piezoresistive detector, or a frequency detector.

7. The microelectromechanical or nanoelec-tromechanical device according to claim 6, wherein the detector comprises at least one piezoresistive gauge, and advantageously two piezoresistive gauges arranged on either side of the axis of the pivot link.

8. The microelectromechanical or nanoelec-tromechanical device according to claim 7, wherein the second part is connected to the first part by suspension means, the second part of the seismic mass being capable of moving in a plane of the seismic mass, the suspension means being formed by at least one spring deforming in the plane.

9. The microelectromechanical or nanoelec-tromechanical device according to claim 1, wherein the second part is connected to the first part by suspension means, the second part of the seismic mass having a movement outside a plane of the seismic mass, the suspension means being formed by at least one spring deforming out of plane.

10. The microelectromechanical or nanoelec-tromechanical device according to claim 1, wherein the first part forms a frame inside which the second part is suspended.

11. The microelectromechanical or nanoelec-tromechanical device according to claim 1, comprising two seismic masses each comprising a first and a second part connected to each other and able to move relative to each other, the first parts being rigidly connected by an arm, the pivot link being made on the arm, and the detector detecting the movement of said arm, the two second parts moving in phase relative to each other.

12. The microelectromechanical or nanoelec-tromechanical device according to claim 1, comprising a seismic mass having at least first and second parts able to move relative to each other, the pivot link being made on the first part, the actuator being arranged between the support and the second part and being exerted thereon via an intermediate seismic mass capable of moving only along the excitation axis, said first and second parts being positioned relative to each other so that an axis cutting the axis of the pivot link and passing through the center of gravity of the mass, in the absence of excitation, is perpendicular to the direction of the force to be detected.

13. The microelectromechanical or nanoelec-tromechanical device according to claim 1, wherein the at least one seismic mass is suspended by a beam, the axis of the pivot link being substantially orthogonal to a device plane.

14. The microelectromechanical or nanoelec-tromechanical device according to claim 13, wherein the detector comprises piezoresistive gauge(s) and the seismic mass is connected by a mechanical link, which is situated on or as close as possible to a plane containing the center of gravity and the axis of the pivot link.

15. The microelectromechanical or nanoelec-tromechanical device according to claim 1, wherein the seismic mass is suspended by a torsion shaft, an axis of the torsion shaft being contained in the plane.

16. The microelectromechanical or nanoelec-tromechanical device according to claim 1, comprising counter-reaction electrodes and/or electrodes for adjusting a resonance frequency.

17. An accelerometer formed by a microelectromechanical or nanoelec-tromechanical device for detecting an acceleration force following a given direction, comprising:
    a support,
    at least one seismic mass capable of moving under an effect of the acceleration force to be measured in the direction of said acceleration force, said mass comprising at least first part and second part able to move relative to each other a detector for detecting the movement of said seismic mass, said seismic mass being articulated relative to the support by at least one pivot link, and an actuator capable of making a distance between an axis of the pivot link and the center of gravity of the exertion of the acceleration force on said seismic mass vary at high frequency, said actuator being capable of moving the second part of the seismic mass relative to the first part of the seismic mass in a direction different from that of the acceleration force, called excitation axis, wherein the accelerometer includes only one actuator for one seismic mass for the given direction of the force to be detected.

18. The accelerometer according to claim 17, comprising electrodes for compensating quadrature bias on which a direct voltage and an alternating voltage are applied at a frequency that is twice an excitation frequency.

19. The accelerometer according to claim 17 being implemented under vacuum.

* * * * *